United States Patent
Kim

(10) Patent No.: US 12,550,516 B2
(45) Date of Patent: Feb. 10, 2026

(54) EFFECT OF SOURCE-DRAIN ELECTRIC FIELD ON CHARGE TRANSPORT MECHANISM IN POLYMER-BASED THIN-FILM TRANSISTORS

(71) Applicant: University of Seoul Industry Cooperation Foundation, Seoul (KR)

(72) Inventor: Hyeok Kim, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 478 days.

(21) Appl. No.: 18/089,903

(22) Filed: Dec. 28, 2022

(65) Prior Publication Data

US 2023/0209843 A1    Jun. 29, 2023

(30) Foreign Application Priority Data

Dec. 28, 2021   (KR) .......................... 10-2021-0190431

(51) Int. Cl.
*H10K 10/46* (2023.01)
*H10K 10/84* (2023.01)
*H10K 71/12* (2023.01)

(52) U.S. Cl.
CPC ........... *H10K 10/462* (2023.02); *H10K 10/84* (2023.02); *H10K 71/12* (2023.02)

(58) Field of Classification Search
None
See application file for complete search history.

(56) References Cited

PUBLICATIONS

J.-I. Park, H.-S. Jeong, D.-K. Kim, J. Jang, I. M. Kang, P. Lang, Y.-H. Kim, H. Kim, J.-H. Bae, Crystals 2019, 9, 346.
(Continued)

*Primary Examiner* — Anthony Ho
(74) *Attorney, Agent, or Firm* — NKL Law; Jae Youn Kim

(57) ABSTRACT

Provided are a polymer thin-film transistor and a method of fabricating the same. Donor-acceptor copolymer-based field-effect transistors (FETs) have attracted considerable attention from technological and academic perspectives due to their low band gap, high mobility, low cost, easy solution processability, flexibility, and stretchability. Large-area films can be formed through meniscus-guided coating among various solution-processing techniques. 29-Diketopyrrolo-pyrrole-selenophene vinylene selenophene (29-DPP-SVS) donor-acceptor copolymer-based FETs have already shown excellent performance due to their short π-π stacking distance and strong π-π interaction. Charge carrier mobility of these types of semiconductor materials significantly depends on an applied electric field. Accordingly, detailed analysis of the electric-field dependency of charge carrier mobility is necessary to understand the transport mechanism within the material. Therefore, 29-DPP-S VS-based FETs are fabricated by varying the blade coating (BC) speed of a semiconductor layer. The effect of the BC speed on the electrical characteristics of the FETs is studied through the analysis of electric-field-dependent mobility. The results show that the charge carrier mobility of different FETs depends on the applied electric field and that the type of dependency is Poole-Frenkel. At an optimized BC speed (2 mm s$^{-1}$), the device shows maximum zero-field mobility (3.39 cm$^2$V$^{-1}$s$^{-1}$) due to the low trap density within the conductive channel.

4 Claims, 7 Drawing Sheets

(56) References Cited

PUBLICATIONS

T. Mosciatti, M. G. Del Rosso, M. Herder, J. Frisch, N. Koch, S. Hecht, E. Orgiu, P. Samorì, Adv. Mater. 2016, 28, 6606.
W. Xu, Z. Hu, H. Liu, L. Lan, J. Peng, J. Wang, Y. Cao, Sci. Rep. 2016, 6, 1.
U. Zschieschang, H. Klauk, J. Mater. Chem. C 2019, 7, 5522.
B. Aïssa, A. Ali, A. Bentouaf, W. Khan, M. Hossain, J. Kroeger, N. M. Muhammad, Nanotechnology 2019, 31, 075201.
M. Kim, S. U. Ryu, S. A. Park, K. Choi, T. Kim, D. Chung, T. Park, Adv. Funct. Mater. 2020, 30, 1904545.
W. W. Bao, R. Li, Z. C. Dai, J. Tang, X. Shi, J. T. Geng, Z. F. Deng, J. Hua, Front. Chem. 2020, 8.
P. Sonar, S. P. Singh, Y. Li, M. S. Soh, A. Dodabalapur, Adv. Mater. 2010, 22, 5409.
R. Kim, P. S. Amegadze, I. Kang, H. J. Yun, Y. Y. Noh, S. K. Kwon, Y. H. Kim, Adv. Funct. Mater. 2013, 23, 5719.
S. Jeon, C. Sun, S. H. Yu, S.-K. Kwon, D. S. Chung, Y. J. Jeong, Y.-H. Kim, ACS Appl. Mater. Interfaces 2019, 12, 2743.
Z. Yi, L. Ma, P. Li, L. Xu, X. Zhan, J. Qin, X. Chen, Y. Liu, S. Wang, Polym. Chem. 2015, 6, 5369.
F. Leonardi, Q. Zhang, Y.-H. Kim, M. Mas-Torrent, Mater Sci Semicond Process. 2019, 93, 105.
S. Kyung, J. Kwon, Y. Kim, S. Jung, IEEE Trans. Electron Devices 2017, 64, 1955.
Z. Yi, S. Wang, Y. Liu, Adv. Mater. 2015, 27, 3589.
L. Shaw, P. Hayoz, Y. Diao, J. A. Reinspach, J. W. To, M. F. Toney, R. T. Weitz, Z. Bao, ACS Appl. Mater. Interfaces 2016, 8, 9285.
J. Y. Back, H. Yu, I. Song, I. Kang, H. Ahn, T. J. Shin, S.-K. Kwon, J. H. Oh, Y.-H. Kim, Chem. Mater. 2015, 27, 1732.
Y. Su, X. Gao, J. Liu, R. Xing, Y. Han, Phys. Chem. Chem. Phys. 2013, 15, 14396.
D.-K. Kim, P. Vincent, J.-H. Kwon, Y.-R. Kim, S.-W. Kang, J.-H. Bae, AIP Adv. 2017, 7, 035319.
S. Biswas, S. Bhattacharya, Phys. Lett. A 2017, 381, 3424.
S. Bhattacharya, U. Rana, S. Malik, J. Phys. Chem. C 2013, 117, 22029.
S. Biswas, B. Dutta, S. Bhattacharya, J. Appl. Phys. 2013, 114, 143701.
S. Biswas, B. Dutta, S. Bhattacharya, Appl. Surf. Sci. 2014, 292, 420.
T. Minari, T. Nemoto, S. Isoda, J. Appl. Phys. 2006, 99, 034506.
P. Stallinga, H. L. Gomes, F. Biscarini, M. Murgia, D. De Leeuw, J. Appl. Phys. 2004, 96, 5277.
S. Cherian, C. Donley, D. Mathine, L. LaRussa, W. Xia, N. Armstrong, J. Appl. Phys. 2004, 96, 5638.
J.-I. Park, H.-S. Jeong, P. Vincent, J. Park, D.-K. Kim, J. Jang, I. M. Kang, H. Kim, Y.-H. Kim, P. Lang, J. Nanosci. Nanotechnol. 2020, 20, 5486.
W. Wu, R. Yao, S. Li, Y. Hu, W. Deng, X. Zheng, IEEE Trans. Electron Devices 2007, 54, 2975.
J. Frenkel, Phys. Rev. 1938, 54, 647.
M. Faustini, B. Louis, P. A. Albouy, M. Kuemmel, D. Grosso, J. Phys. Chem. C 2010, 114, 7637.
L. Landau, B. Levich, in Dynamics of Curved Fronts, Elsevier, Amsterdam 1988, p. 141.
R. Yi, Z. Lou, Y. Hu, S. Cui, F. Teng, Y. Hou, X. Liu, Sci. China Technol. Sci. 2014, 57, 1142.
S. Hoshino, T. Kamata, K. Yase, J. Appl. Phys. 2002, 92, 6028.

EFFECT OF SOURCE-DRAIN ELECTRIC FIELD ON CHARGE TRANSPORT MECHANISM IN POLYMER-BASED THIN-FILM TRANSISTORS

BACKGROUND

1. Field of the Invention

The present invention relates to a method of fabricating a polymer thin-film transistor. More specifically, the present invention relates to a method of fabricating a polymer thin-film transistor by forming a large-area film through meniscus-guided coating.

2. Discussion of Related Art

Organic semiconductor-based field effect transistors (FETs) have attracted considerable attention from the electronic device (sensors, flexible active-matrix displays, radio frequency identification tags, etc.) industry and the academic sectors due to their easy solution processability, mechanical stability, stretchability, flexibility, large-area fabrication ability, and low cost. Several studies have been conducted on improving the performance level of these devices. For example, various organic semiconductor materials, such as small molecules, conjugated polymers, and donor-acceptor copolymers, have been developed and tested for FETs.

According to related studies, the charge carrier mobility of a disordered organic polymer semiconductor material has been observed to strongly depend on an applied electric field. In an FET, such a change in charge carrier mobility caused by a vertical (from the source to the drain) electric field is referred to as the Poole-Frankel (PF) effect.

This type of electric-field- and temperature-dependent behavior (i.e., PF-like behavior) in the charge transport of disordered organic semiconductors fundamentally occurs due to the energy or positional disorder of a hopping site. Various models, such as a polaron hopping model, have been proposed so far to explain PF-like behavior in the electric-field- and temperature-dependent charge carrier mobility of disordered organic semiconductors. Such a type of electric-field-dependent charge carrier mobility is general in FETs based on an organic polymer semiconductor material, but there have been very few studies on this subject.

SUMMARY OF THE INVENTION

The present invention is directed to providing a method of fabricating an organic polymer semiconductor material-based field-effect transistor (FET) showing higher charge carrier mobility.

According to an aspect of the present invention, there is provided a method of fabricating a polymer thin film transistor, the method including coating a substrate with a polymer solution and forming a source electrode and a drain electrode. The polymer solution is a 29-diketopyrrolopyrrole-selenophene vinylene selenophene (29-DPP-SVS) copolymer solution. The coating of the substrate with the polymer solution may include coating an upper side of the substrate with the copolymer solution in accordance with a meniscus-guided coating method of blade coating (BC) solution shearing. The BC includes coating the upper side of the substrate with the copolymer solution at a speed of 2 mm s$^{-1}$.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
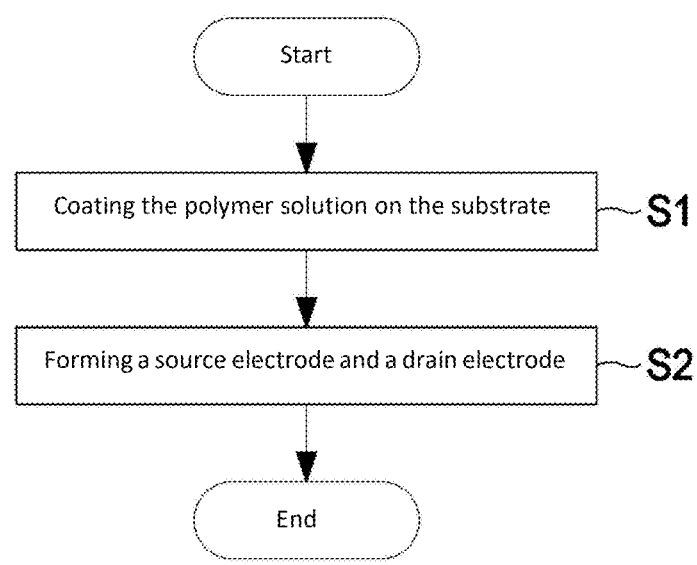
FIG. 1 is a flowchart illustrating a method of fabricating a 29-diketopyrrolopyrrole-selenophene vinylene selenophene (29-DPP-SVS)-based field effect transistor (FET) according to the present invention.

Terminology used in the present specification will be briefly described first, and then exemplary embodiments of the present invention will be described in detail. As terms used herein, general terms currently used as widely as possible will be selected in consideration of functionality in the present invention, but may vary depending on intent of those of ordinary skill in the art, precedents, the advent of new technology, etc. In particular, a term may be arbitrarily selected by the applicant. In this case, the meaning of the term will be explained in detail through the relevant descriptions. Therefore, the terms used herein should be defined on the basis of their meanings and the overall content of the present invention rather than their names.

Hereinafter, exemplary embodiments of the present invention will be described in detail with reference to the accompanying drawings.

Organic semiconductor-based field effect transistors (FETs) have attracted considerable attention from the electronic device (sensors, flexible active-matrix displays, radio frequency identification tags, etc.) industry and the academic world due to their easy solution processability, mechanical stability, stretchability, flexibility, large-area fabrication ability, and low cost. Several studies have been conducted on improving the performance level of these devices. For example, various organic semiconductor materials, such as small molecules, conjugated polymers, and donor-acceptor copolymers, have been developed and tested for FETs.

Lately, donor-acceptor copolymers have attracted considerable attention due to a low bandgap and high charge carrier mobility which are achievable through optimal molecular design of the semiconductor polymers (to achieve a planar-conjugated molecular structure for causing strong π-π interaction). These days, various electron acceptors, such as diketopyrrolopyrrole, benzothiadiazole, and naphthalene diimide, and electron donors, such as cyclopentadithiophene, benzodithiophene, and selenophene vinylene selenophene (SVS), are used for developing numerous semiconductor donor-acceptor copolymers.

Among various donor-acceptor copolymers, 29-diketopyrrolopyrrole-selenophene vinylene selenophene (29-DPP-SVS) shows high charge transport characteristics due to strong π-π interaction and short π-π stacking distance. In general, 29-DPP-SVS-based FETs show p-channel characteristics, and lately, it has been observed that 29-DPP-SVS-based FETs may show hole mobilities of 3.48 $cm^2V^{-1}s^{-1}$ and 2.98 $cm^2V^{-1}s^{-1}$ for glass and polyethylene naphthalate substrates, respectively. Also, 29-DPP-SVS-based flexible FETs have shown excellent environmental and mechanical stability even after 1,200 bending cycles. With the development of semiconductor materials, many efforts have been made to invent efficient coating techniques, such as spin coating and meniscus-guided coating, for these semiconductors in FET fabrication.

Meniscus-guided coating is an organic semiconductor coating technique that is most simple and efficient in terms of time and cost. Meniscus-guided coating is a unidirectional coating method and suitable for ensuring growth uniformity and growing a large-area semiconductor layer with molecular alignment. Currently, there are various meniscus-guided coating methods such as slot die coating and blade coating (BC) solution shearing.

To improve the performance level of an FET, it is necessary not only to develop various semiconductor and FET fabrication techniques but also to study a charge transport mechanism in FETs.

According to related studies, the charge carrier mobility of a disordered organic polymer semiconductor material has been observed to strongly depend on an applied electric field. In an FET, such a change in charge carrier mobility caused by a vertical (from the source to the drain) electric field is referred to as the Poole-Frankel (PF) effect.

This type of electric-field- and temperature-dependent behavior (i.e., PF-like behavior) in charge transport in disordered organic semiconductors fundamentally occurs due to the energy or positional disorder of a hopping site. Various models, such as a polaron hopping model, have been proposed so far to explain PF-like behavior in the electric-field- and temperature-dependent charge carrier mobility of disordered organic semiconductors. Such a type of electric-field-dependent charge carrier mobility is general in FETs based on an organic polymer semiconductor material, but there have been very few studies on this subject.

Lately, it has been reported that sexithiophene-based FETs may show PF-type field-dependent mobility. On the basis of this phenomenon, it is assumed that there is a deep trap state in a channel. Also, PF behavior has been observed from liquid crystal-based organic transistors. From this study, it is clear that a systematic study on the electric-field dependency of charge carrier mobility may help to understand the characteristics of a transport mechanism in a partially aligned organic polymer semiconductor. Also, in this way, various fabrication techniques, such as coating speed, coating temperature, and semiconductor solution concentration, may be optimized to achieve better performance.

In the present invention, 29-DPP-SVS-based FETs having a structure in which a bottom gate is in contact with the top are fabricated by varying coating speed of a semiconductor layer. A BC technique is used for coating.

Influence of a BC speed on a charge transport mechanism in an FET has been found by analyzing electric-field-dependent mobility in detail.

As a result, charge carrier mobility values of various FETs strongly depend on an applied electric field, and the type of dependency corresponds to a PF type.

Also, it has been observed that FETs may show higher charge carrier mobility at an optimal BC speed of a semiconductor layer due to a reduction in the trap-state density of a conductive channel.

FIG. 1 is a flowchart illustrating a method of fabricating a 29-DPP-SVS-based FET according to the present invention.

According to the present invention, the method includes an operation of coating a substrate with a polymer solution and an operation of forming a source electrode and a drain electrode. The polymer solution is a 29-DPP-SVS copolymer solution. The operation of coating the substrate with the polymer solution is performed by coating an upper side of the substrate with the copolymer solution in accordance with a meniscus-guided coating method of BC solution shearing. The BC involves coating the upper side of the substrate with the copolymer solution at a speed of 2 mm $s^{-1}$.

Figure 2:
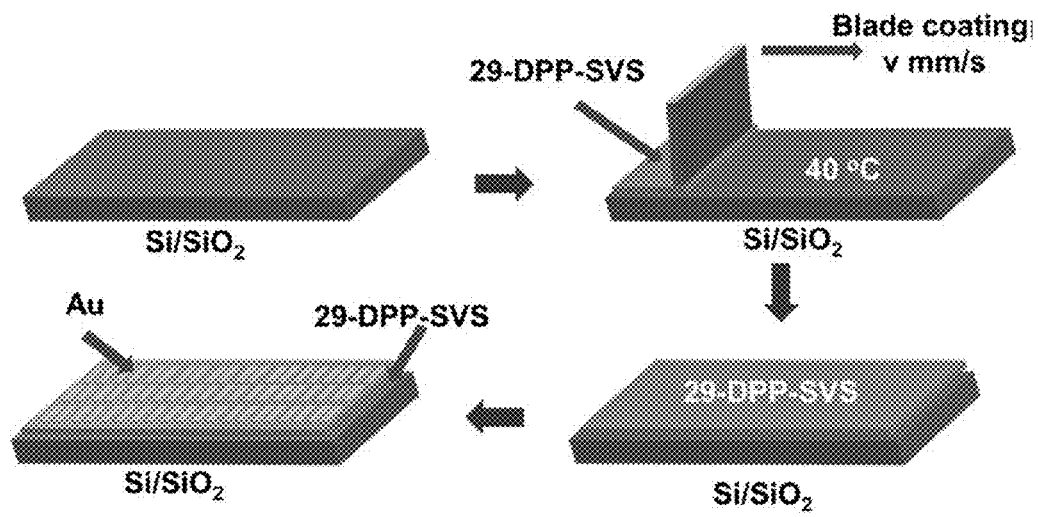
FIG. 2 is a diagram illustrating a procedure for fabricating a 29-DPP-SVS-based FET according to the present invention.

FIG. 2 is a diagram illustrating a procedure for fabricating a 29-DPP-S VS-based FET. As a substrate and a gate electrode, a silicon (Si) wafer (p type) doped with boron (B) was used. Also, a thermally grown $SiO_2$ layer having a thickness of 100 nm was used as a gate insulator of the device.

First, a B-doped Si substrate coated with $SiO_2$ was cleaned through an ultrasonication bath using acetone (Sigma Aldrich), isopropyl alcohol (Sigma Aldrich), and deionized water (purified using a pure RO 15 reverse osmosis system). For each case, the time of the ultrasonication bath was 15 minutes (fixed).

The 29-DPP-SVS polymer solution was prepared by dissolving the polymer in chlorobenzene (Sigma Aldrich). Here, the concentration of 29-DPP-SVS was fixed at 6 mg/mL. To obtain a homogeneous solution, the solution was stirred at 600 rpm for 24 hours.

Before coating, the solution was filtered using a 0.2 μm polytetrafluoroethylene syringe. After that, the $SiO_2$-deposited B-doped Si substrate which was cleaned in advance at 40° C. was coated with the 29-DPP-SVS solution.

Lately, it has been confirmed that a BC temperature is a very important factor for fabricating a high-efficiency FET. A high BC temperature (higher than the boiling point of the solvent) may cause degradation of a polymer film and formation of pores and pinholes in a semiconductor layer of an FET. Also, it has been disclosed that an optimal BC temperature for a 29-DPP-SVS-based FET is 35° C. to 45° C. in terms of electrical performance. Preferably, in the present invention, a BC temperature for each FET was fixed at 40° C. To study the influence of BC speed on device performance, four different FETs were fabricated with 29-DPP-SVS layers coated at speeds of 0.6, 2, 4, and 6 mm $s^{-1}$.

After 29-DPP-SVS coating was completed, the substrate was annealed at a temperature of 200° C. for 10 minutes in a $N^2$ atmosphere glove box. Subsequently, the substrate was transferred to a chamber of a thermal deposition system, and source and drain electrodes were formed of gold (with a shadow mask) on the 29-DPP-SVS film using a vacuum thermal evaporation technique. The thicknesses of the source and drain electrodes were fixed at 50 nm. The pressure and evaporation rate were fixed at $\frac{1}{10}^6$ torr and 0.1 nm $s^{-1}$. A channel length L and a width W of each device were 50 μm and 1000 μm, respectively.

Figure 3:
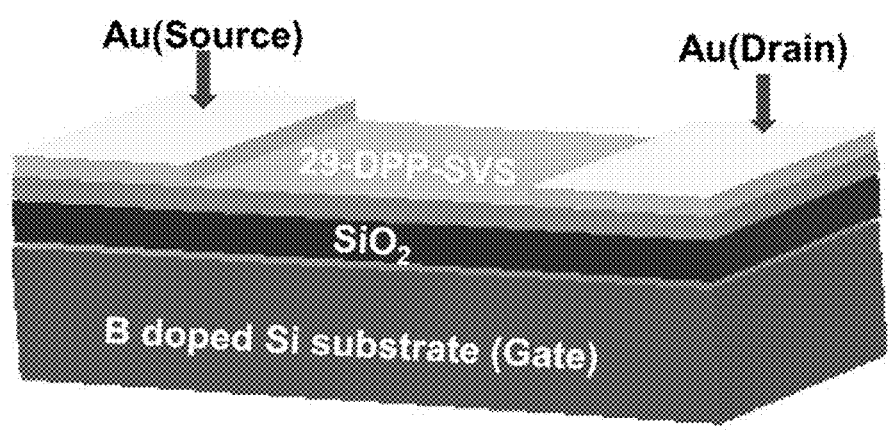
FIG. 3 is a schematic diagram of an FET fabricated according to the present invention.

A schematic diagram of the fabricated FETs is shown in FIG. 3.

The devices were evaluated at room temperature under ambient pressure in dark conditions using a Keithley semiconductor analyzer (model number 2636B).

Result

To characterize the FETs coated with 29-DPP-SVS layers at the BC speeds of 0.6, 2, 4, and 6 mm s$^{-1}$, record curves (drain current [I$_D$] versus drain voltage [V$_D$]) were measured under different conditions. A gate voltage V$_G$ has a value of 0 V to −60 V. A drain voltage V$_G$ has a value of 0 V to −60 V.

Figure 4:
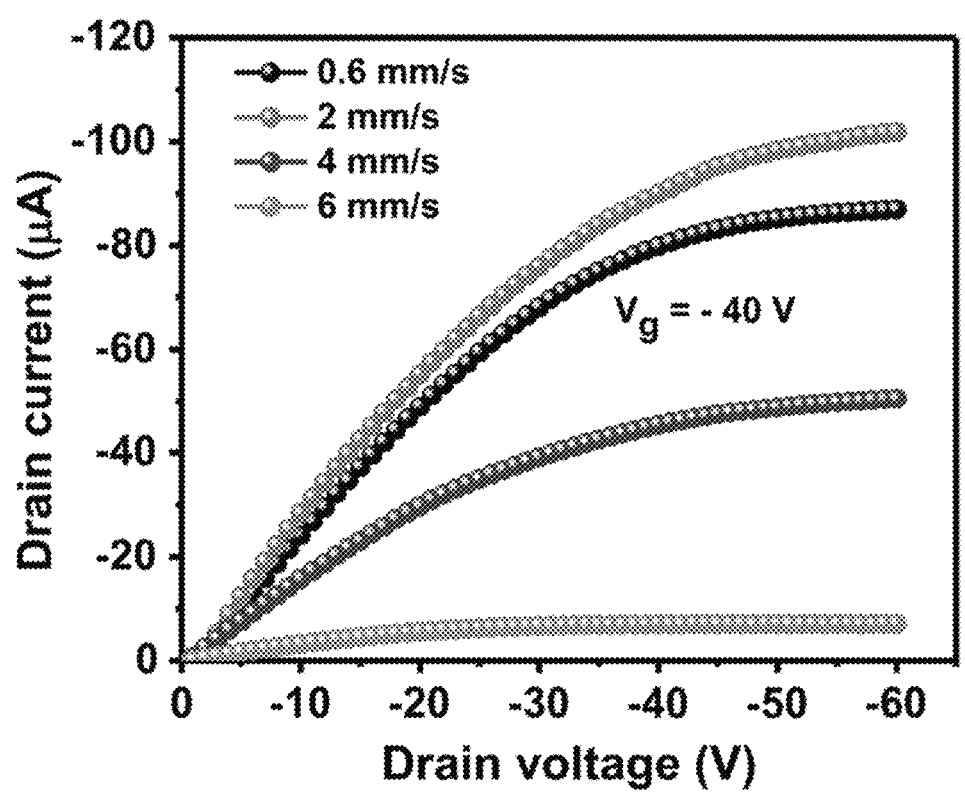
FIG. 4 is a graph showing output characteristic curves of FETs coated with a 29-DPP-SVS semiconductor layer at different blade coating (BC) speeds.

FIG. 4 is a graph showing output characteristic curves of FETs coated with a 29-DPP-SVS semiconductor layer at the BC speeds of 0.6, 2, 4, and 6 mm s$^{-1}$ with respect to V$_G$=40 V. Referring to FIG. 4, output characteristics of the FETs show saturated behavior during their operation in a p-channel accumulation mode. Further, the value of a saturated drain-source current I$_{Dsat}$ of the FETs significantly depends on the coating speed of their semiconductor layers. The value of I$_{Dsat}$ is maximum at a BC speed of 2 mm s$^{-1}$, followed by 0.6, 4, and 6 mm s$^{-1}$.

The present invention is focused on the variation of the charge carrier mobility at different longitudinal electric field (E=V$_D$/L) values. ID values for FETs were extracted for different VG values within the range of 0 V to −60 V at a particular V$_D$ value.

Figure 5A:
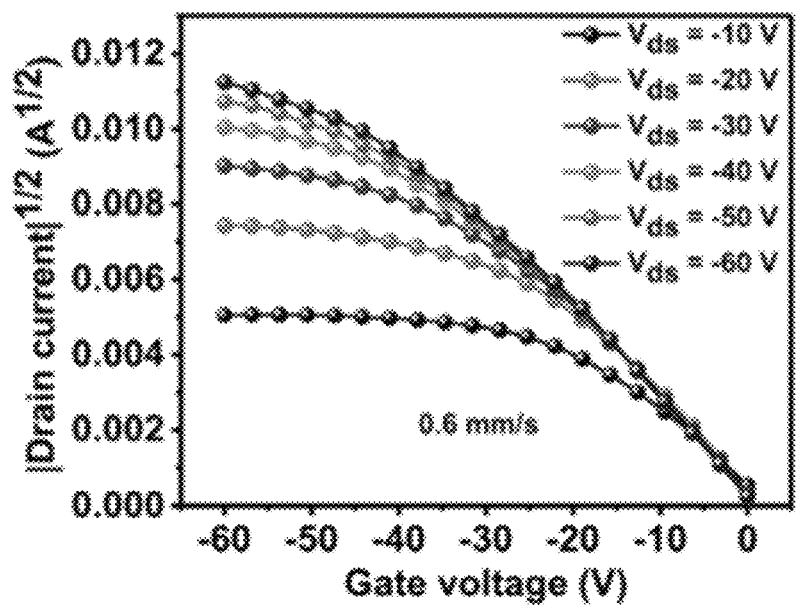
FIGS. 5(a)-5(d) are a set of graphs showing variation of the square root of a drain current with respect to various drain voltage values in accordance with a gate voltage of FETs coated at different BC speeds.
Figure 5B:
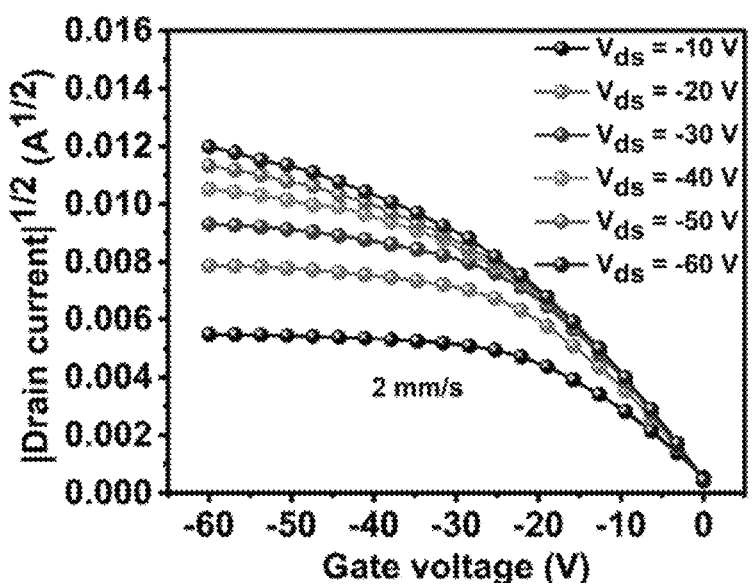
Figure 5C:
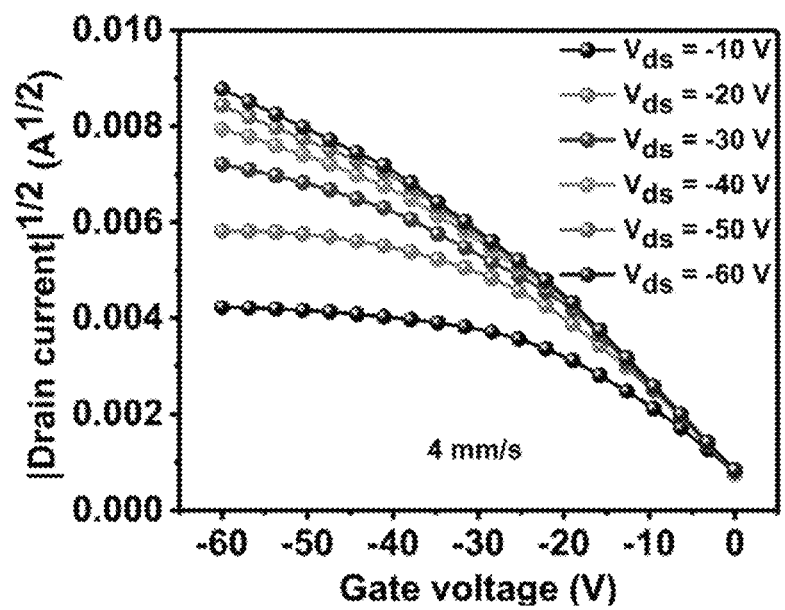
Figure 5D:
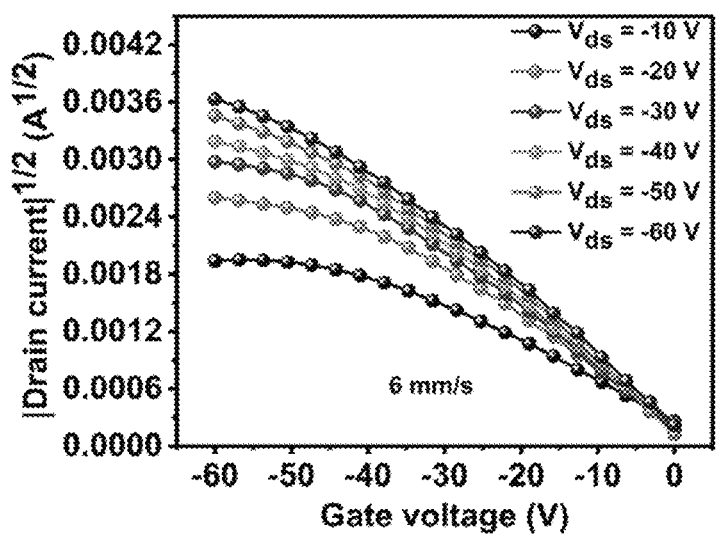

Subsequently, $\sqrt{I_D}$ was plotted with different V$_G$ values of the FETs having the 29-DPP-SVS layers coated at 0.6, 2, 4, and 6 mm s$^{-1}$ at different V$_D$ values (−10, −20, −30, −40, −50, and −60 V) for further analysis. FIG. 5(a) shows the variation of $\sqrt{I_D}$ with V$_G$ (at different V$_D$ values) of the FETs having the 20-DPP-SVS layers coated at 0.6, 2, 4, and 6 mm s$^{-1}$. It is well known that the field-effect charge carrier mobility $\mu_{sat}$ at the saturation region of an FET may be estimated from the slope of $\sqrt{I_D}$ versus the V$_G$ curve using Equation 1 below.

$$\mu_{sat} = \frac{2L}{WC}\left(\frac{\partial\sqrt{I_{Dsat}}}{\partial G}\right)^2 \quad \text{[Equation 1]}$$

Figure 6:
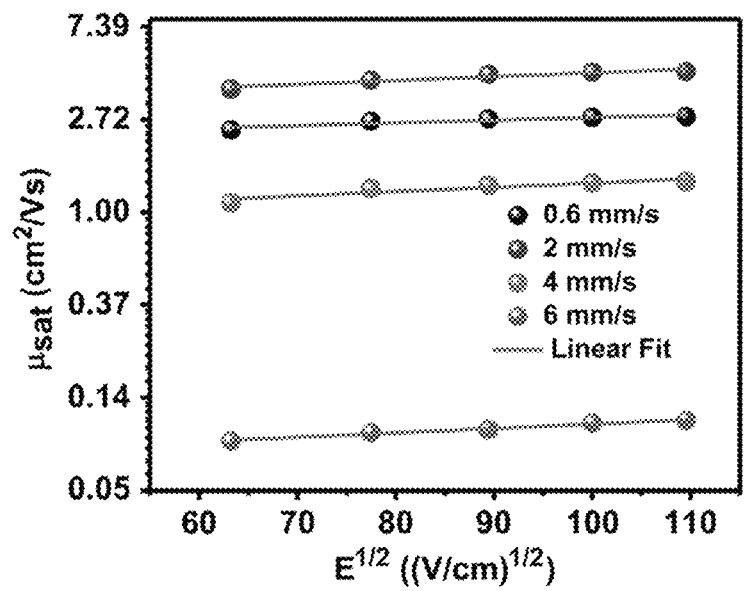
FIG. 6 is a graph showing variation of the field-effect charge carrier mobility of FETs coated at different BC speeds.

Therefore, $\mu_{sat}$ of the FETs was additionally estimated for different longitudinal voltages (i.e., V$_D$). Then, the $\mu_{sat}$ values of the different FETs were plotted. FIG. 6 is a graph showing the variation of $\mu_{sat}$ of FETs having semiconductor layers coated at the speeds of 0.6, 2, 4, and 6 mm s$^{-1}$. FIG. 6 shows that the $\mu_{sat}$ value is not the same for all FETs. Also, the value of $\mu_{sat}$ for a particular device increases with an increase in the applied longitudinal electric field E. This type of electric-field-dependent charge carrier mobility may be described with the PF law.

The charge carrier transport mechanism in these types of disordered semiconductor materials occurs by phonon-assisted hopping of charge carriers between localized states which are disordered in space and energy. Due to this phenomenon, the charge carrier mobility of these materials depends on the electric field and temperature, and mobility generally increases with an applied electric field and temperature. According to the universal PF law, the electric-field- and temperature-dependent charge carrier mobility may be expressed as shown in Equation 2 below.

$$\mu(E,T)=\mu_0\exp(0.89\gamma\sqrt{E}) \quad \text{[Equation 2]}$$

Here, $\mu$(E, T) is the charge carrier mobility, $\mu_0$ is the zero-field mobility, and $\gamma$ is the PF factor which is basically estimated from the intensity of positional disorder such as hopping distance or width of the state density of the disordered semiconductor.

The zero-field mobility also varies depending on the temperature and is expressed as shown in Equation 3 below.

$$\mu_0(T) = \mu_0(0)\exp\left(-\frac{E_{pol}}{kT}\right) \quad \text{[Equation 3]}$$

Here, $\mu_0$ is the mobility prefactor, E$_{pol}$ is the polaronic binding energy, k is the Boltzmann constant, and T is the temperature. The PF factor may determine the effect of the electric field on the charge carrier mobility. A lower value of the PF factor indicates a lower trap state (i.e., a shallower hopping barrier or shorter hopping distance in the direction of the applied electric field).

Therefore, a lower value of the PF factor may result in higher charge carrier mobility within the material. The PF factor also varies depending on the temperature and may be expressed as shown in Equation 4 below.

$$\gamma = \left(\frac{1}{T} - \frac{1}{\tau_0}\right)\frac{D}{k} \quad \text{[Equation 4]}$$

Here, T$_g$ and D are fitting parameters to be determined.

Figure 7:
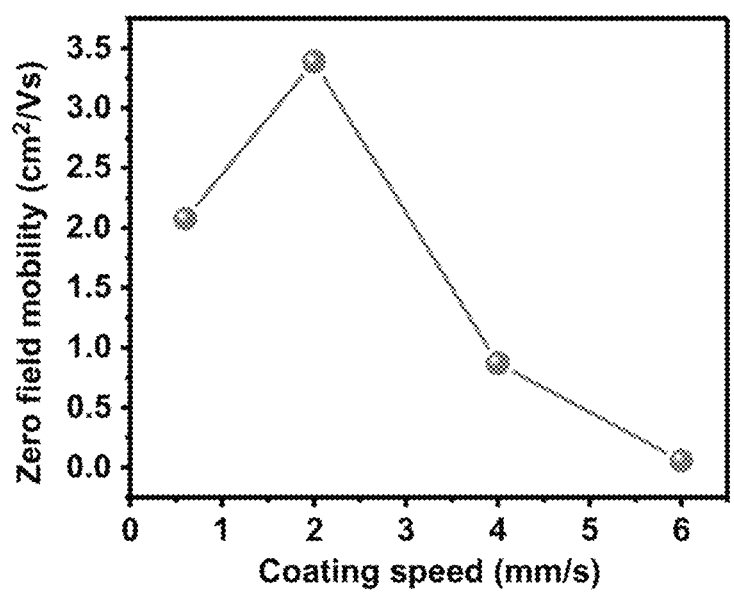
FIG. 7 is a graph showing variation of the zero-field mobility of FETs having semiconductor layers coated at different speeds.

To estimate the values of $\mu_0$ and $\gamma$ of the FETs having the 29-DPP-SVS layers coated at the BC speeds of 0.6, 2, 4, and 6 mm s$^{-1}$, the $\mu_{sat}$ versus $\sqrt{E}$ curves of these devices were further analyzed using Equation 2. FIG. 7 is a graph showing the variation of $\mu_0$ of FETs in accordance with BC speeds.

FIG. 7 shows that the value of $\mu_0$ of an FET significantly depends on the coating speed of its semiconductor (29-DPP-SVS) layer. In the case of a very low coating speed, the value of $\mu_0$ is lower (2.08 cm$^2$V$^{-1}$s$^{-1}$), and $\mu_0$ reaches the highest value (3.39 cm$^2$V$^{-1}$s$^{-1}$) at the speed of 2 mm s$^{-1}$. With a further increase in the coating speed, $\mu_0$ gradually decreases. At the speed of 6 mm s$^{-1}$, the value of $\mu_0$ is reduced to 0.56 cm$^2$V$^{-1}$s$^{-1}$.

To determine the reason for this phenomenon, the variation of the value of $\gamma$ of FETs are visualized in accordance with the BC speed of their semiconductor layers (29-DPP-SVS).

Figure 8:
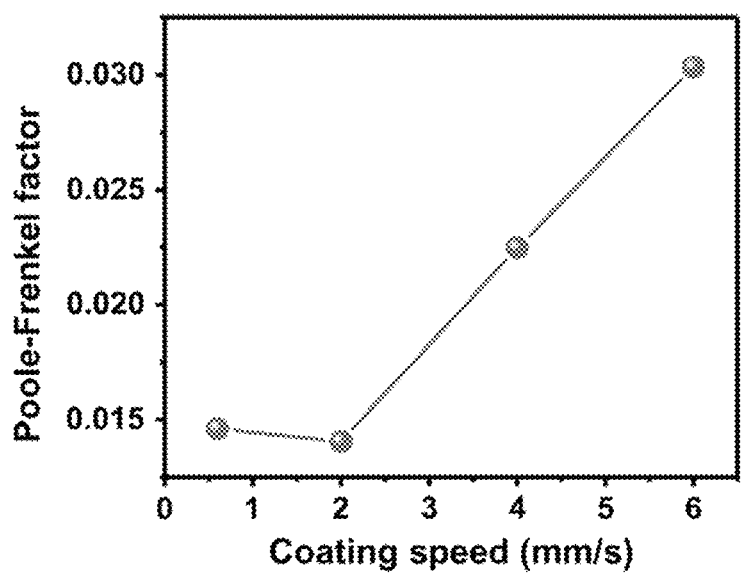
FIG. 8 is a graph showing variation of the Poole-Frenkel (PF) factor of an FET in accordance with a BC speed of a semiconductor layer.

FIG. 8 shows that the value of PF factor is not the same for all the devices. At a very low coating speed (0.6 mm s$^{-1}$), the value $\gamma$ is 0.015. At 2 mm s$^{-1}$, the value decreases slightly and reaches its minimum (0.014). The value increases again with an increase in the coating speed. These results show that, at an optimum coating speed (2 mm s$^{-1}$) of a semiconductor layer, the hopping distance between two localized states becomes shorter due to a reduction in trap state density within a conductive channel of the FETs and the device shows the maximum (3.39 cm$^2$V$^{-1}$s$^{-1}$) of zero-field mobility under the coating condition (2 mm s$^{-1}$).

According to the related art, it has been observed that a higher coating speed may result in the formation of a thicker semiconductor layer. At sufficiently high speeds, the coating mechanism mainly involves the Landau-Levich process, which explains the equilibrium between the dragging force of viscosity and the adhesion of the solution onto the substrate. The thickness of the semiconductor layer was 25.8, 35.7, 51.5, and 73.3 nm at the BC speeds of 0.6, 2, 4, and 6 mm s$^{-1}$, respectively. Accordingly, at the lowest coating speed (i.e., 0.6 mm s$^{-1}$), the thickness of the semiconductor layer was sufficiently thin, and the conductive channel was located near the gate insulator interface.

Therefore, the effect of the trap state (formed at the interface between the semiconductor and a dielectric layer) on the charge carrier mechanism is stronger, which results in a lower charge carrier mobility value at a very low coating speed.

When the BC speed was slightly increased, the thickness of the 29-DPP-SVS layer was increased. The charge carrier mobility was improved due to the slight shift of the conductive channel away from the semiconductor insulator interface by the vertical electric field induced by the gate bias which is opposite to that generated in the gate insulator. However, in the case of a thicker semiconductor layer which is formed by a higher BC speed, the strength of the vertical electric field per unit thickness was reduced. This reduction induces an increase in the trap state density and hopping distance between two localized states in the channel and results in a significant reduction in carrier mobility. The variation of the PF factor in accordance with the coating speeds of the semiconductor layers of the FETs supports this assumption.

The FETs based on a 29-DPP-SVS polymer semiconductor were fabricated at different BC speeds. The BC speeds of the 29-DPP-SVS were 0.6, 2, 4, and 6 mm s$^{-1}$. Also, the effect of the BC speed on the charge carrier transport mechanism within the device was examined through a detailed analysis of the longitudinal electric field (i.e., an electric field generated by the drain voltage $V_D$)-dependent charge carrier mobility. It was observed that the charge carrier mobility of different FETs significantly depends on both the BC speed and applied electric field. The longitudinal electric-electric field dependency of charge carrier mobility was of the PF type.

Further, it was observed that the charge carrier mobility of an FET based on an organic polymer semiconductor can be improved by optimizing the BC speed of the semiconductor layer. At an optimized BC speed (2 mm s$^{-1}$), the device shows maximum zero-field mobility (3.39 cm$^2$V$^{-1}$s$^{-1}$) due to the presence of a smaller number of trap states in the conductive channel.

According to the present invention, it is possible to fabricate a polymer thin film transistor through growth of a large-area semiconductor layer.

Also, according to the present invention, it is possible to fabricate a polymer thin film transistor showing higher charge carrier mobility.

The above exemplary embodiments of the present invention have been disclosed for the purpose of illustration, and those skilled in the art can make various modifications, alterations, and additions within the spirit and scope of the present invention. Such modifications, alterations, and additions should be considered to fall within the scope of the claims.

Since those skilled in the technical field to which the present invention pertains can make various substitutions, modifications, and alterations without departing from the technical spirit of the present invention, the present invention is not limited by the above-described embodiments and the accompanying drawings.

What is claimed is:

1. A method of fabricating a polymer thin-film transistor, the method comprising:
   coating a substrate with a 29-diketopyrrolopyrrole-selenophene vinylene selenophene (29-DPP-SVS) copolymer solution; and
   forming a source electrode and a drain electrode,
   wherein the coating of the substrate with the copolymer solution comprises coating an upper side of the substrate with the copolymer solution in accordance with a meniscus-guided coating method of blade coating (BC) solution shearing, and
   the BC comprises coating the upper side of the substrate with the copolymer solution at a speed of 2 mm s$^{-1}$.

2. The method of claim 1, wherein the substrate is a silicon wafer doped with boron (B).

3. The method of claim 1, further comprising, before the coating of the substrate, forming a thermally grown silicon dioxide (SiO$_2$) layer.

4. The method of claim 1, wherein the coating of the substrate comprises coating the substrate at a BC temperature of 35° C. to 45° C.

* * * * *